(12) United States Patent
Roizin et al.

(10) Patent No.: US 11,543,290 B2
(45) Date of Patent: Jan. 3, 2023

(54) ULTRAVIOLET SENSOR AND A METHOD FOR SENSING ULTRAVIOLET RADIATION

(71) Applicant: Tower Semiconductors Ltd., Migdal Haemek (IL)

(72) Inventors: Yakov Roizin, Afula (IL); Pikhay Evgeny, Haifa (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 353 days.

(21) Appl. No.: 16/947,004

(22) Filed: Jul. 14, 2020

(65) Prior Publication Data

US 2022/0018708 A1 Jan. 20, 2022

(51) Int. Cl.
| | |
|---|---|
| *G01J 1/42* | (2006.01) |
| *H01L 27/144* | (2006.01) |
| *H01L 31/02* | (2006.01) |
| *G01J 1/04* | (2006.01) |
| *H01L 31/105* | (2006.01) |
| *H01L 31/18* | (2006.01) |
| *H01L 31/0216* | (2014.01) |

(52) U.S. Cl.
CPC ............ *G01J 1/429* (2013.01); *G01J 1/0407* (2013.01); *G01J 1/4228* (2013.01); *H01L 27/1446* (2013.01); *H01L 31/02019* (2013.01); *H01L 31/02165* (2013.01); *H01L 31/105* (2013.01); *H01L 31/18* (2013.01)

(58) Field of Classification Search
CPC ........ G01J 1/429; G01J 1/0407; G01J 1/4228; G01J 1/0488; H01L 27/1446; H01L 31/02019; H01L 31/02165; H01L 31/105; H01L 31/18
See application file for complete search history.

(56) References Cited

U.S. PATENT DOCUMENTS

| | | | | |
|---|---|---|---|---|
| 9,370,600 B1* | 6/2016 | DuPuis | ............ | F21V 14/08 |
| 11,219,701 B1* | 1/2022 | Sahu | ............ | A61L 9/20 |
| 11,231,510 B1* | 1/2022 | Roizin | ............ | G01T 1/243 |
| 2019/0046812 A1* | 2/2019 | Harlan | ............ | A61C 5/30 |
| 2022/0026266 A1* | 1/2022 | Evgeny | ............ | G01J 1/429 |

* cited by examiner

*Primary Examiner* — David P Porta
*Assistant Examiner* — Meenakshi S Sahu
(74) *Attorney, Agent, or Firm* — Reches Patents (57) ABSTRACT

An ultraviolet sensor that may include a group of serially connected photovoltaic diodes of alternating polarities; a selective blocking portion that is configured to prevent ultraviolet radiation from reaching photovoltaic diodes that belong to the group and are of a first polarity, while allowing the ultraviolet radiation to reach photovoltaic diodes that belong to the group and are of a second polarity; and an interface for providing an output signal of the group, the output signal is indicative of ultraviolet radiation sensed by the photovoltaic diodes that belong to the group and are of the second polarity.

22 Claims, 6 Drawing Sheets

ULTRAVIOLET SENSOR AND A METHOD FOR SENSING ULTRAVIOLET RADIATION

BACKGROUND OF THE INVENTION

There is increasing interest in ultraviolet (UV) sensors for a variety of applications. For example, measuring the UV index of solar radiation became more popular due to the increase of awareness of people to the exposure to UV radiation, justified by the increase in ground-level ultraviolet radiation due to ozone depletion effects in the atmosphere.

Portable devices supplied with UV sensors (e.g. mobile phones) would allow measurements of integral exposure to UV radiation and also new functions, such as proximity and motion control, UV communication, etc.

Special importance have UVC sensors used in sterilization devices for disinfection from germs and viruses. Their importance increased after it was shown that COVID-19 can be destroyed with UVC radiation.

UV sensors can be fabricated from compound materials, such as SiC and GaN, but such devices are expensive and it is difficult to integrate them with Complementary Metal Oxide Semiconductor (CMOS) electronics. Silicon photo sensors on bulk silicon usually have poor sensitivity in UV spectral range compared with sensitivity to visible light.

The known solution that allows fabricating silicon UV sensors is using Silicon on Isolator (SOI) wafers with thin (typically below 0.5 um) device layer.

UV sensors with SOI wafers employ special electronic circuit to subtract a response from visible light from the total photo-response of the sensor and thus measure the UV component only.

These UV sensors with SOI wafers use single photovoltaic diodes with combinations of different filters (absorbing films). Single photovoltaic diodes generate very small voltages at low light intensities (at the level of microwatt/cm$^2$) and thus two-channel amplifiers with high gain are required that additionally complicate the sensor design.

The known approaches have limitations in distinguishing UV radiation from visible/IR background using silicon devices.

There is a growing need to provide a UV sensor that has increased selectivity.

According to an embodiment of the invention there may be provided a UV sensor and a method for sensing UV radiation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There is provided a UV sensor that may be manufactured by using fabrication processes that can be easily integrated into standard process flows (e.g., established CMOS, or MEMS process flows) without requiring any (or requiring very few) additional masks. For example, in one embodiment light-sensitive diodes are formed on a thick polycrystalline silicon layer typically formed on silicon dioxide insulation layers during standard shallow trench isolation (STI) processes often used in CMOS process flows. Yet for another example—the light-sensitive diodes may be formed on bullied oxide (BOX) layer—using standard SOI manufacturing processes.

Furthermore—UV filters may be manufactured using an additional CMOS mask—or even without this additional mask—but by performing an etch process for selectively removing some of the UV filters.

Figure 1:
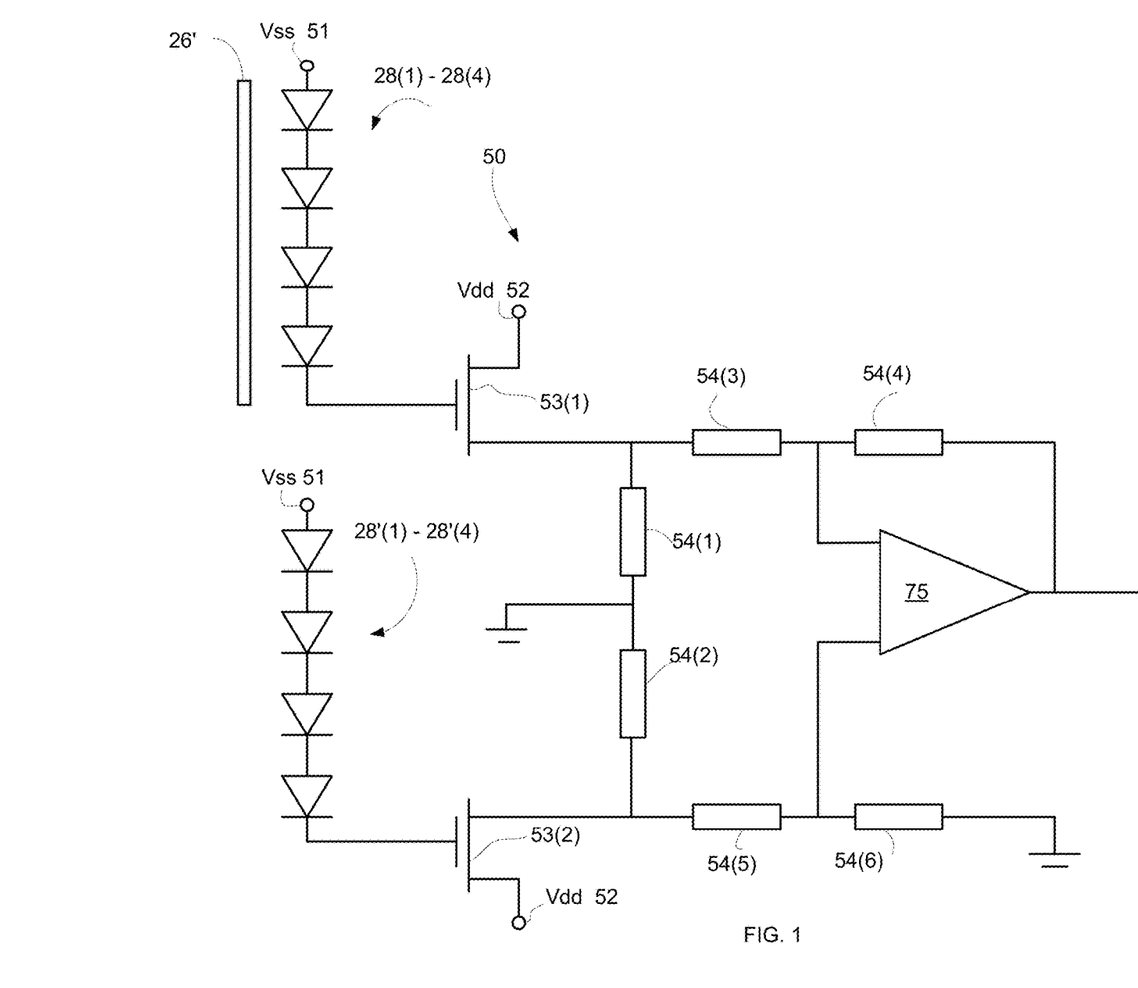
FIG. 1 is example of a UV sensor.

FIG. 1 illustrates an example of a UV sensor.
The UV sensor may include:
a. A first sequence of serially coupled photovoltaic diodes of a same polarity 28(1)-28(4). The same polarity means that an anode of one photovoltaic diode is connected to a cathode of an adjacent photovoltaic diode. The first sequence may be formed in a device layer.
b. A second sequence of serially coupled photovoltaic diodes of the same polarity 28'(1)-28'(4). The second sequence may be formed in a device layer. The first and second sequences may be positioned near each other—or otherwise arranged to detect substantially the same amount of visible light and IR radiation. This may be assisted by using lenses or other optics before the UV sensor.
c. A selective blocking portion 26' that is configured to prevent ultraviolet radiation from reaching photovoltaic diodes of the first sequence, while allowing the ultraviolet radiation to reach photovoltaic diodes of the second sequence.

d. A processing circuit 50 that is configured to process a first output signal outputted from the first sequence (or generated based on the output of the first sequence), and a second output signal outputted from the second sequence (or generated based on the output of the second sequence), to provide an indication about ultraviolet radiation that was sensed by the second sequence.

The processing circuit 50 is configured to subtract the first output signal from the second output signal.

In FIG. 1 the processing circuit is illustrated as including:

a. A first input transistor 53(1) having its gate coupled to the output of the first sequence of serially coupled photovoltaic diodes to receive a first output voltage from the first sequence.

b. Second input transistor 53(2) having its gate coupled to the output of the second sequence of serially coupled photovoltaic diodes to receive a second output voltage from the second sequence.

c. A network of resistors 54(1)-54(6).

d. An operational amplifier 75 that is connected as a subtractor.

The first and second input transistors form a differential pair of transistors, which allows to decrease the footprint of the sequences of the photovoltaic diodes—as there is no need for high currents to be measured. The first and second input transistors (and some of the resistors of the network), convert the first and second output voltages to first and second currents. The second current is subtracted from the first current (or vice versa) so that the operational amplifier 75 outputs a signal that represents the UV radiation.

Figure 2:
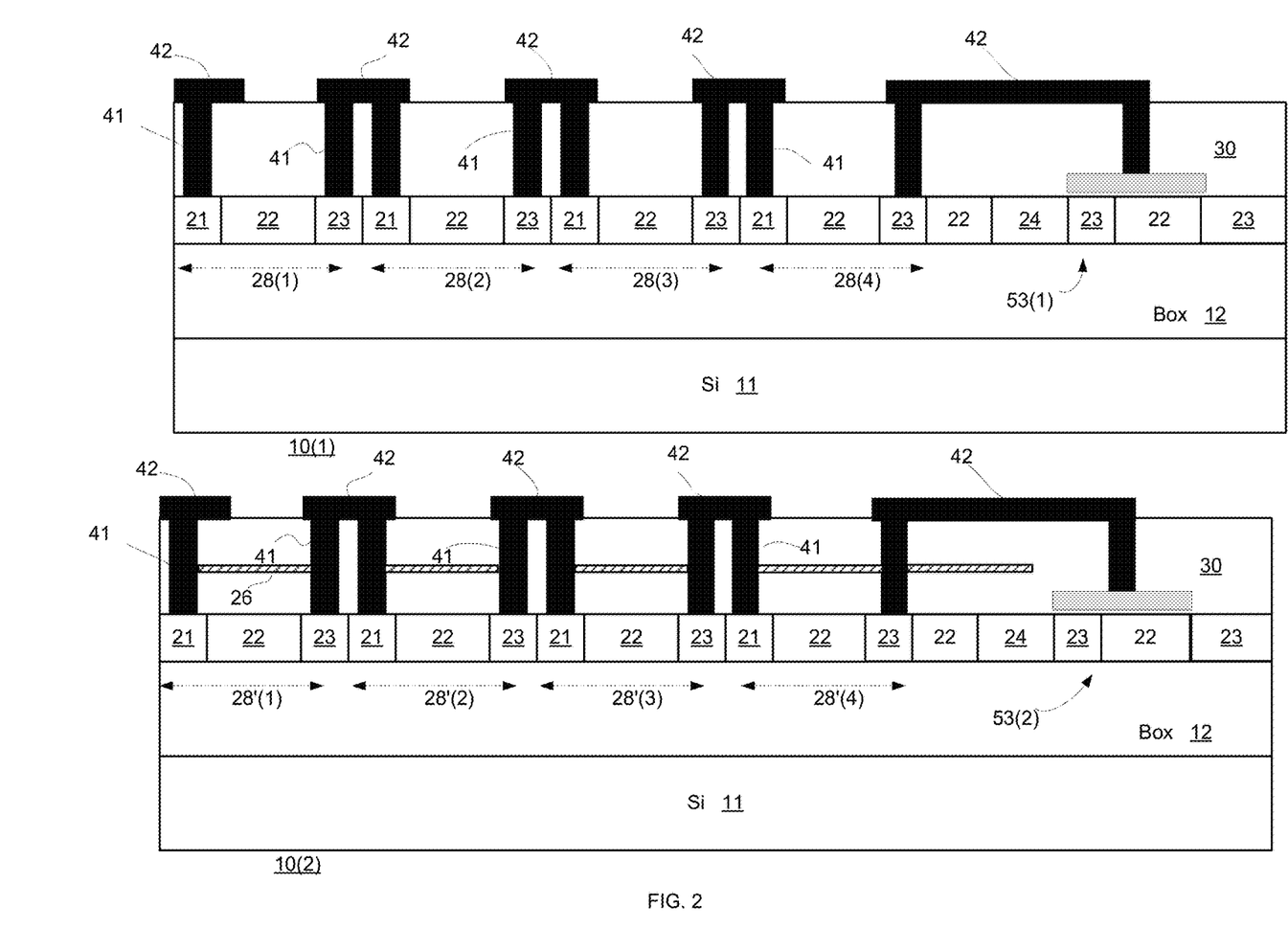
FIG. 2 is example of parts of a UV sensor.

FIG. 2 illustrates examples of a first part 10(1) of the UV sensor, and a second part 10(2) of the UV sensor.

The first part 10(1) includes (from top to bottom):

a. A Silicon layer 11.

b. A BOX layer 12.

c. A device layer that includes the photovoltaic diodes of the same polarity. Each photovoltaic diode includes a P+ region 21 followed by an intrinsic region 22 that is followed by a N+ region 23.

d. A pre-metal dielectric layer (PMD) 30. The PMD may be replaced by any combination of layers—for example multiple layers of dielectric materials—including back-end (B/E) dielectric layers.

e. Interconnects 41 that are formed in (pass through) the PMD and are coupled to metal one (M1) conductors 42. The interconnects and M1 conductors (i) form a first input (for connecting the first sequence to supply Vss), (ii) sequentially connect the photovoltaic diodes to each other, and (iii) connect the end of the sequence to the gate of the first input transistor 53(1).

The second part 10(2) includes (from top to bottom):

a. A Silicon layer 11.

b. A BOX layer 12.

c. A device layer that includes the photovoltaic diodes of the same polarity. Each photovoltaic diode includes a P+ region 21 followed by an intrinsic region 22 that is followed by a N+ region 23.

d. A pre-metal dielectric layer (PMD) 30. The PMD may be replaced by any combination of layers—for example multiple layers of dielectric materials—including back-end (B/E) dielectric layers.

e. UV filters 26 formed within the PMD 30 and above the device layer.

f. Interconnects 41 that are formed in (pass through) the PMD and are coupled to metal one (M1) conductors 42. The interconnects and M1 conductors (i) form a first input (for connecting the second sequence to supply Vss), (ii) sequentially connect the photovoltaic diodes to each other, and (iii) connect the end of the sequence to the gate of the second input transistor 53(2).

The UV filters (also referred to as UV cut off filters) cut off filters may be formed in various manners. For example—they may be included as a Si or Poly absorbing layer having thickness in the range 500-200 nm. The UV filters may be formed as a continuous layer, so that contacts are etched through it. Another option is using a special mask to pattern the UV filters in the places of the contacts. Corresponding flavors of the UV filters may have back end dielectrics transparent to UV.

Figure 3:
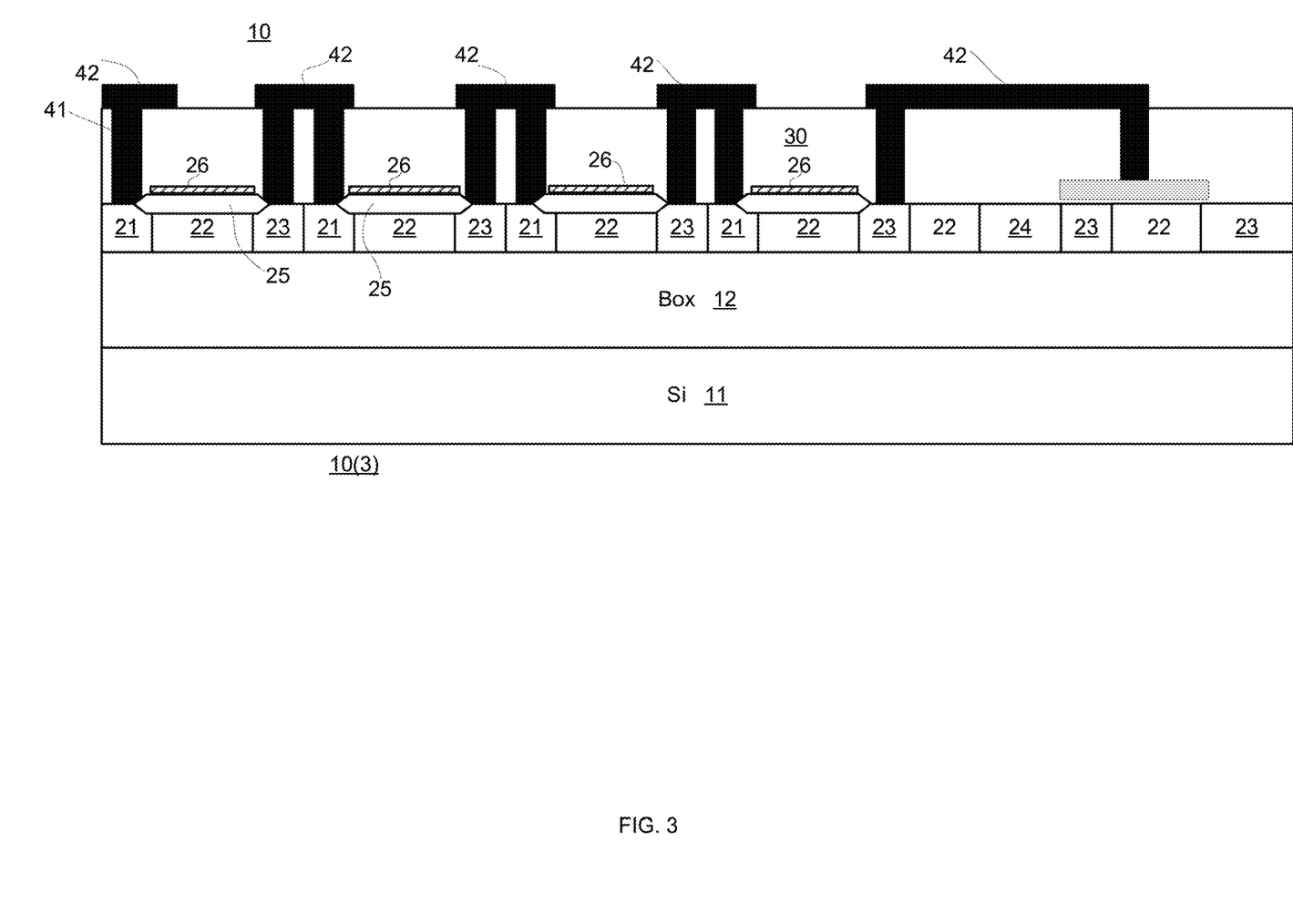
FIG. 3 is example of a part of a UV sensor.

FIG. 3 illustrates another example of a first part of UV sensor 10(3).

The UV sensor includes a sequence of photovoltaic diodes of the same polarity—and all photovoltaic diodes are preceded by a UV filter 26. Another part of the UV sensor (not shown) may include the same sequence of photovoltaic diodes—but without the UV filters 26.

The UV filters may be formed over a thick (for example between 1000-300 Angstrom thick) field oxide (FOX) region 25 that may be formed by oxidation or deposition. The FOX region 25 may be thinner than the STI regions.

The UV filters 26 are formed from Polysilicon

The leftmost photovoltaic diode is connected to Vss terminal. The rightmost photovoltaic diode is connected to the gate of transistor under the metal shield 42. Region 24 is the isolation of the photovoltaic diodes from the transistor located under 42.

In integrated with CMOS embodiment, introducing the spaced apart 25 oxide regions may require a dedicated mask.

It should be noted that the oxide region may be formed as a continuous layer and the interconnects 41 may pass through it.

Alternatively—the oxide region and/or an oxide layer may be a relatively thin gate oxide of thickness that may range between 70 to 100 Angstrom.

Figure 4:
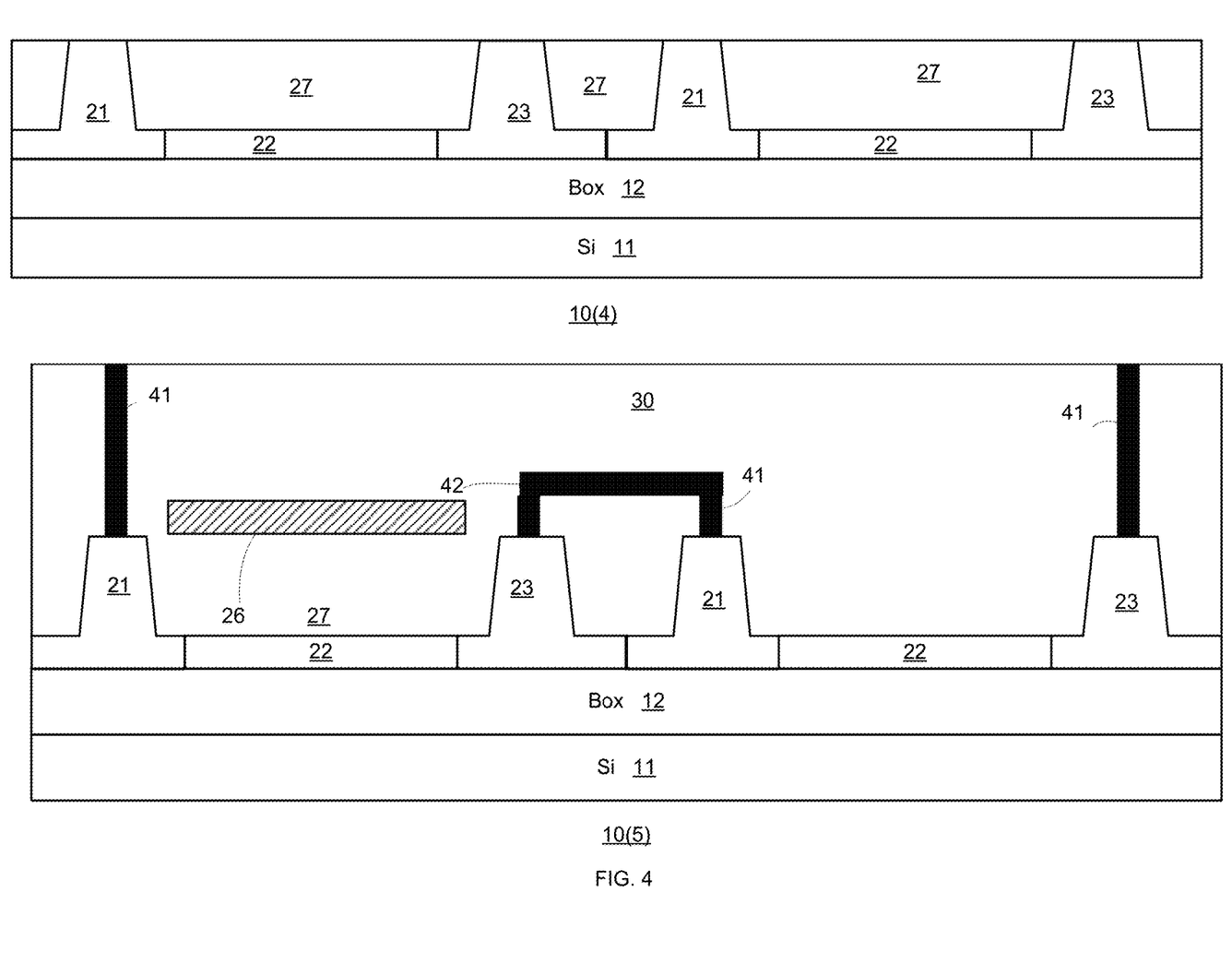
FIG. 4 is example of parts of a UV sensor.
Figure 5:
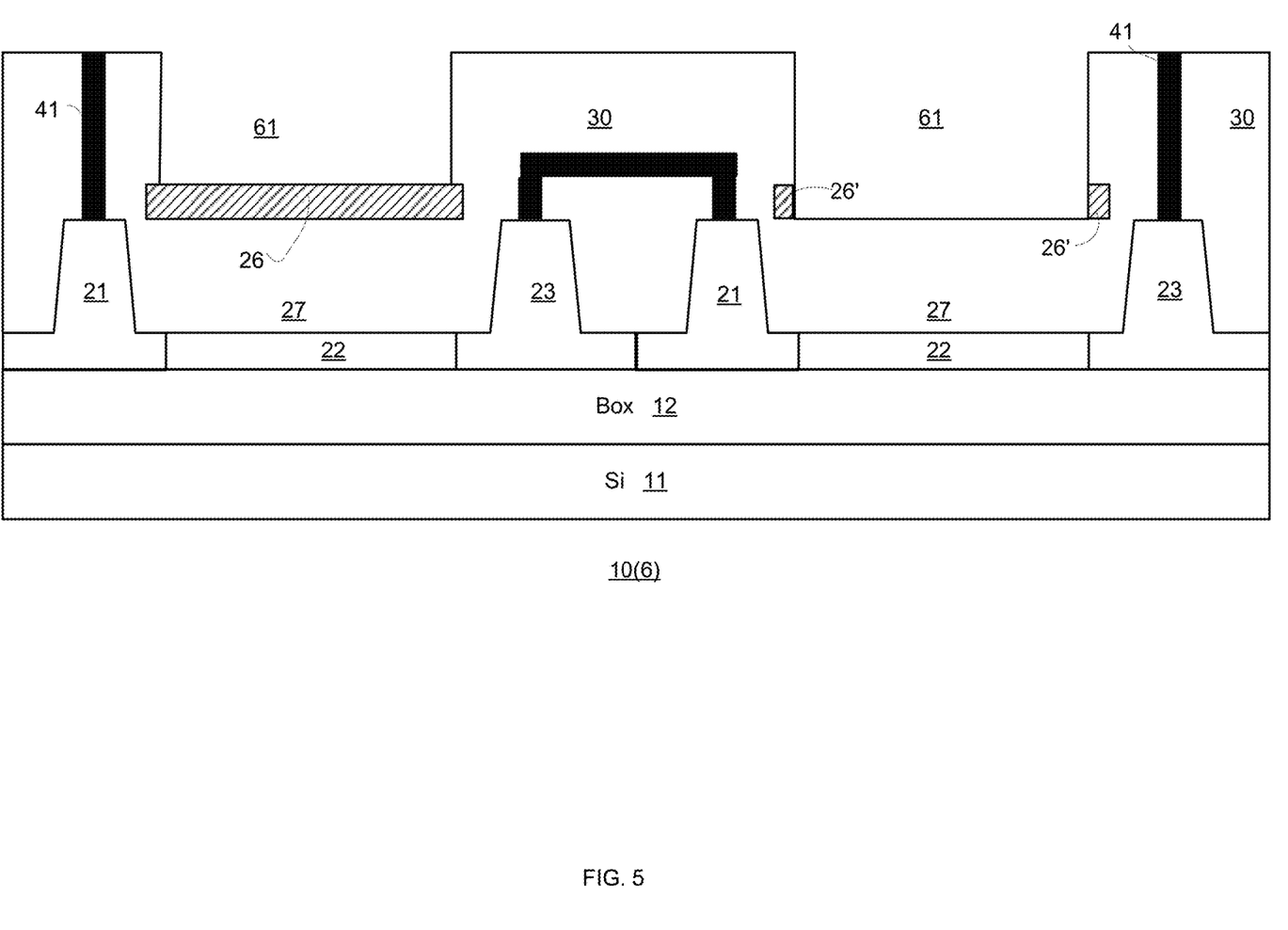
FIG. 5 is example of a part of a UV sensor.

FIGS. 4 and 5 illustrate parts 10(4), 10(5) and 10(6) of the UV sensor.

Part 10(4) represents an intermediate phase of the manufacturing process. This intermediate phase may be followed by additional manufacturing phases that may lead to either one of part 10(5) and part 10(6).

In these parts, there are shallow trench isolation (STI) regions 27 above the photovoltaic diodes. The STI regions may be thinner than the device layer—for example 350 nm versus 500-600 nm. The P+ and N+ regions are formed by special diffusions that penetrate to the bottom of the device layer.

The UV filter 26 of part 10(5) is manufactured using the masks of the CMOS process flow. th Gate Control CMOS mask (Poly etch) and no salicidation mask are used to form UV filters only above some of the photovoltaic diodes.

In another embodiment, the UV filter 26 of part 10(5) is left over all photo-diodes. Then, using a dedicated masks back end dielectrics including PMD are removed over Poly UV filters 26 and then Poly is removed selectively for some of photo-diodes (additional mask). The etching forms gaps 61 in the PMD 30 or any other layer (such as B/E dielectric) above the UV filters.

Figure 6:
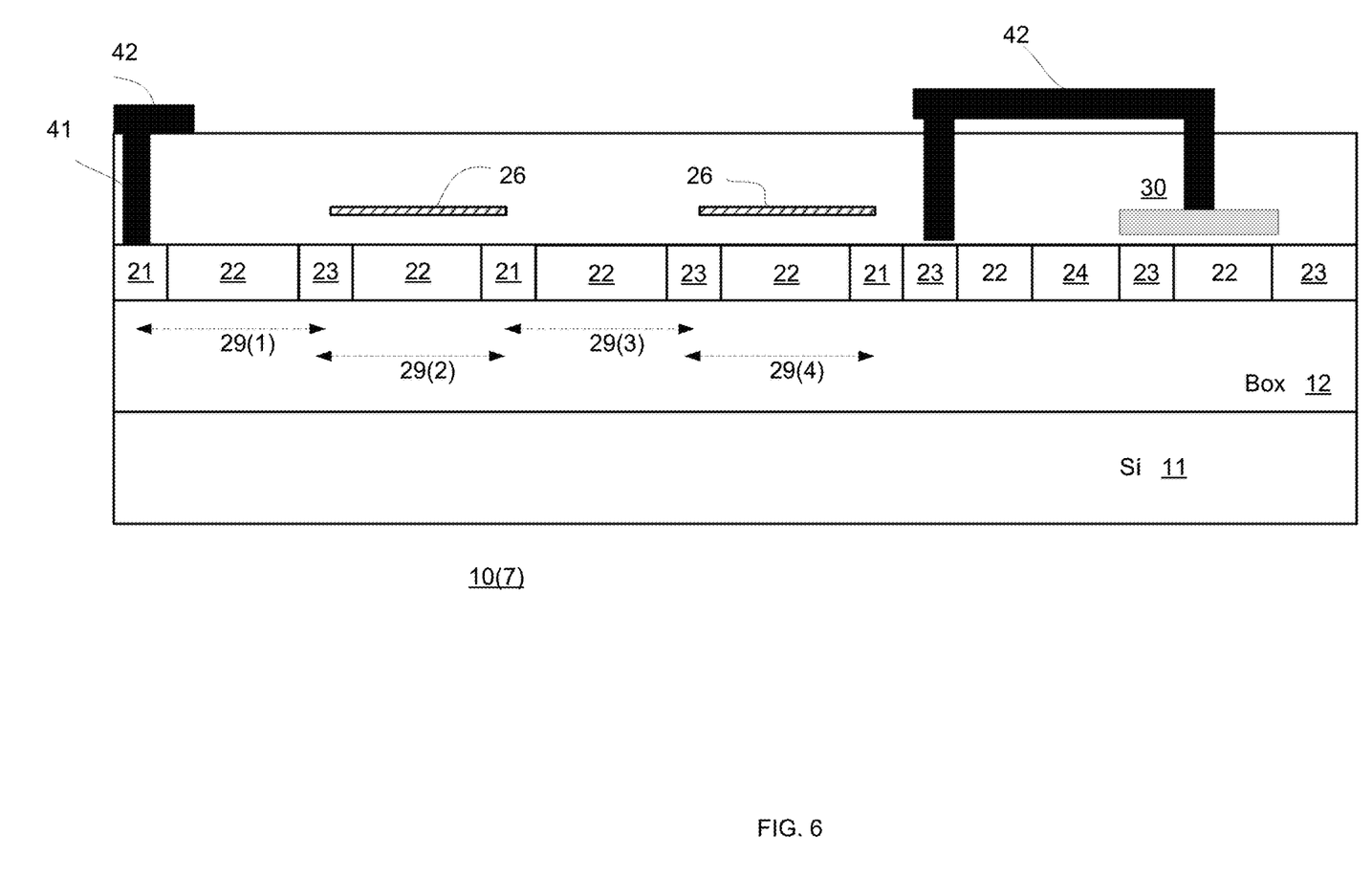
FIG. 6 is example of a part of a UV sensor.

FIG. 6 illustrates an example of a UV sensor 10(7).

UV sensor 10(7) includes:

a. A group of serially connected photovoltaic diodes of alternating polarities. See for example photovoltaic diodes 29(1)-29(4) formed in a device layer. The alternating polarities mean that odd photovoltaic diodes 29(1) and 29(3) are of opposite polarity than even photovoltaic diodes 29(2) and 29(4). The anode of a photovoltaic diode is connected to a cathode of an adjacent photodiode.

b. A selective blocking portion (that includes UV filters 26) that is configured to prevent ultraviolet radiation from reaching photovoltaic diodes that belong to the group and are of a first polarity, while allowing the ultraviolet radiation to reach photovoltaic diodes that belong to the group and are of a second polarity. The photovoltaic diodes of the first polarity may be the odd photovoltaic diodes or the even photovoltaic diodes.

c. An interface for providing an output signal of the group, the output signal is indicative of ultraviolet radiation sensed by the photovoltaic diodes that belong to the group and are of the second polarity.

d. A transistor having its gate connected to the rightmost photovoltaic diode 29(4).

In FIG. 6, adjacent photovoltaic diodes of the group share a doped region out of a P+ doped region and a N+ doped region. For example, first photovoltaic diode 29(1) shares a P+ region 23 with second photovoltaic diode 29(2). Second photovoltaic diode 29(2) shares a N+ region 21 with third photovoltaic diode 29(3).

The photovoltaic diodes are formed by multiple sequences of (a) a P+ doped region 21, (b) an intrinsic region 22, and (c) an N+ doped region 23. The fourth photovoltaic diode 29(4) follows the multiple sequences.

In FIG. 6, interface consists essentially of a first interconnect 41 that is electrically coupled to a start of the group (P+ region 21 of first photovoltaic diode 29(1)) and to a second interconnect 41' that is electrically coupled to a MOS transistor that in turn is connected to the end of the group (N+ region 23 of fourth photovoltaic diode 29(4)).

The number of photovoltaic diodes may be in the range of 2-200.

The connection of the photovoltaic diodes having alternating polarities causes signals related to the reception of the IR and visible light to be cancelled. The remaining signal is the signal that represented the UV radiation—as it is only sensed by the unmasked photovoltaic diodes—and it is not negated or compensated by signals from the masked photovoltaic diodes.

The photovoltaic diodes add the response of each unmasked photovoltaic diode to the UV radiation—to provide an output voltage that reflects (for example is proportional) to the intensity of UV radiation only.

The group of photovoltaic diodes is connected to the gate of the transistor. The high resistance of the diodes with filters on the top of them connected in series with the voltage generating in response to photovoltaic diodes is irrelevant since the group of photovoltaic diodes is connected to a gate of a MOS transistor. In this case only frequency response is compromised.

By adding the UV related signals within the sequence of diodes and by subtracting the IR or visible light signals within the sequence—an external processing circuit is redundant—or is highly simplified. Furthermore—the output signal is more immune to noise.

The UV filters may be implemented in any manner—especially in any manner mentioned above.

The non-UV radiation (visible light and infrared radiation) that reaches the photovoltaic diodes of the first polarity is attenuated (by the UV filter)—and thus is of lower intensity than the non-UV radiation that reaches the photovoltaic diodes of the first polarity. There is a need to compensate for this difference—for example by having photovoltaic diodes of the first polarity that have an upper surface that exceeds by size an upper surface of the photovoltaic diodes of the second polarity.

There may be provided a method for sensing UV radiation using any of the illustrated above UV sensors.

There may be provided a method for manufacturing any of the illustrated above UV sensors. The method may include manufacturing different elements of the UV sensor at different manufacturing phases.

For example, the method may include (a) manufacturing a group of serially connected photovoltaic diodes of alternating polarities; (b) manufacturing a selective blocking portion that is configured to prevent ultraviolet radiation from reaching photovoltaic diodes that belong to the group and are of a first polarity, while allowing the ultraviolet radiation to reach photovoltaic diodes that belong to the group and are of a second polarity; and (c) manufacturing an interface for providing an output signal of the group, the output signal is indicative of ultraviolet radiation sensed by the photovoltaic diodes that belong to the group and are of the second polarity.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An ultraviolet (UV) sensor, comprising:
a group of serially connected photovoltaic diodes of alternating polarities;
a selective blocking portion that is configured to prevent UV radiation from reaching photovoltaic diodes that belong to the group and are of a first polarity, while allowing the UV radiation to reach photovoltaic diodes that belong to the group and are of a second polarity; and
an interface for providing an output signal of the group, the output signal is indicative of UV radiation sensed by the photovoltaic diodes that belong to the group and are of the second polarity.

2. The UV sensor according to claim 1 wherein the selective blocking portion comprises multiple spaced apart UV filters that are positioned upstream to the photovoltaic diodes that belong to the group and are of the first polarity.

3. The UV sensor according to claim 1 wherein adjacent photovoltaic diodes of the group share a doped region out of a P+ doped region and a N+ doped region.

4. The ultraviolet sensor according to claim 1 wherein the group comprises of multiple sequences of (a) a P+ doped region, (b) an intrinsic region, and (c) an N+ doped region.

5. The UV sensor according to claim 1 wherein the interface consists essentially of a first interconnect that is electrically coupled to a start of the group and to a second interconnect that is electrically coupled to a transistor that is connected to an end of the group.

6. The UV sensor according to claim 1 comprising a transistor having a gate that is connected to the group of serially coupled photovoltaic diodes.

7. The UV sensor according to claim 1 wherein an area of an upper surface of the photovoltaic diodes that belong to the group and are of the first polarity exceeds an area an upper surface of the photovoltaic diodes that belong to the group and are of the second polarity.

8. The UV sensor according to claim 1 wherein a response of the photovoltaic diodes that belong to the group and are of the first polarity to radiation that differs from UV radiation that passes through the selective blocking portion equals a response of the photovoltaic diodes that belong to the group and are of the second polarity to radiation that differs from UV radiation that impinges on the photovoltaic diodes that belong to the group and are of the second polarity.

9. A method for sensing ultraviolet (UV) radiation, comprising:
exposing a UV sensor to a combination of UV radiation and non-UV radiation; wherein the UV sensor comprises a group of serially connected photovoltaic diodes of alternating polarities;
preventing, by a selective blocking portion of the UV sensor, the UV radiation from reaching photovoltaic diodes that belong to the group and are of a first polarity, while allowing the UV radiation to reach photovoltaic diodes that belong to the group and are of a second polarity; and
providing, by an interface of the UV sensor, an output signal of the group, the output signal is indicative of UV radiation sensed by the photovoltaic diodes that belong to the group and are of the second polarity.

10. The method according to claim 9 wherein the selective blocking portion comprises multiple spaced apart UV filters that are positioned upstream to the photovoltaic diodes that belong to the group and are of the first polarity.

11. The method according to claim 9 wherein adjacent photovoltaic diodes of the group share a doped region out of a P+ doped region and a N+ doped region.

12. The method according to claim 9 wherein the group comprises of multiple sequences of (a) a P+ doped region, (b) an intrinsic region, and (c) an N+ doped region.

13. The method according to claim 9 wherein the interface consists essentially of a first interconnect that is electrically coupled to a start of the group and to a second interconnect that is electrically coupled to a transistor that is connected to an end of the group.

14. The method according to claim 9 wherein the UV sensor comprises a transistor having a gate that is connected to the group of serially coupled photovoltaic diodes.

15. The method according to claim 9 wherein an area of an upper surface of the photovoltaic diodes that belong to the group and are of the first polarity exceeds an area an upper surface of the photovoltaic diodes that belong to the group and are of the second polarity.

16. The method according to claim 9 wherein a response of the photovoltaic diodes that belong to the group and are of the first polarity to radiation that differs from UV radiation that passes through the selective blocking portion equals a response of the photovoltaic diodes that belong to the group and are of the second polarity to radiation that differs from UV radiation that impinges on the photovoltaic diodes that belong to the group and are of the second polarity.

17. A method for manufacturing an ultraviolet (UV) sensor, the method comprises:

manufacturing a group of serially connected photovoltaic diodes of alternating polarities;

manufacturing a selective blocking portion that is configured to prevent UV radiation from reaching photovoltaic diodes that belong to the group and are of a first polarity, while allowing the UV radiation to reach photovoltaic diodes that belong to the group and are of a second polarity; and manufacturing an interface for providing an output signal of the group, the output signal is indicative of UV radiation sensed by the photovoltaic diodes that belong to the group and are of the second polarity.

18. An ultraviolet (UV) sensor, comprising:

a first sequence of serially coupled photovoltaic diodes of a same polarity;

a second sequence of serially coupled photovoltaic diodes of the same polarity;

a selective blocking portion that is configured to prevent UV radiation from reaching photovoltaic diodes of the first sequence, while allowing the UV radiation to reach photovoltaic diodes of the second sequence; and a processing circuit that is configured to process a first output signal outputted from the first sequence, and a second output signal outputted from the second sequence, to provide an indication about UV radiation that was sensed by the second sequence.

19. The ultraviolet sensor according to claim 18 wherein the processing circuit is configured to perform a subtraction operation.

20. A method for sensing ultraviolet (UV) radiation, comprising:

exposing a UV sensor to a combination of UV radiation and non-UV radiation; wherein the UV sensor comprises a first sequence of serially coupled photovoltaic diodes of a same polarity, and a second sequence of serially coupled photovoltaic diodes of the same polarity;

preventing, by a selective blocking portion of the UV sensor, UV radiation from reaching photovoltaic diodes of the first sequence, while allowing the UV radiation to reach photovoltaic diodes of the second sequence; and processing, by a processing circuit of the UV sensor, a first output signal outputted from the first sequence, and a second output signal outputted from the second sequence, to provide an indication about the UV radiation that was sensed by the second sequence.

21. The method according to claim 20 comprising performing a subtraction operation.

22. A method for manufacturing an ultraviolet (UV) sensor, the method comprising:

manufacturing (a) a first sequence of serially coupled photovoltaic diodes of a same polarity, and (b) a second sequence of serially coupled photovoltaic diodes of the same polarity;

manufacturing a selective blocking portion that is configured to prevent UV radiation from reaching photovoltaic diodes of the first sequence, while allowing the UV radiation to reach photovoltaic diodes of the second sequence; and manufacturing a processing circuit that is configured to process a first output signal outputted from the first sequence, and a second output signal outputted from the second sequence, to provide an indication about UV radiation that was sensed by the second sequence.

* * * * *